United States Patent [19]

Tallman

[11] Patent Number: 4,663,511

[45] Date of Patent: May 5, 1987

[54] STEREOSCOPIC OPTICAL VIEWING SYSTEM

[75] Inventor: Clifford S. Tallman, Walnut Creek, Calif.

[73] Assignee: The United States of America as represented by the United States Department of Energy, Washington, D.C.

[21] Appl. No.: 858,987

[22] Filed: May 2, 1986

[51] Int. Cl.$^4$ .............................................. B23K 15/00
[52] U.S. Cl. ...................... 219/121 EC; 219/121 EL; 219/121 ED; 350/510; 350/514; 350/515
[58] Field of Search ................ 219/121 EC, 121 ED, 219/121 EB, 121 EM, 121 EL, 121 EP; 350/514–515, 516, 510, 519, 523, 526, 276 R

[56] References Cited

U.S. PATENT DOCUMENTS

| | | | |
|---|---|---|---|
| 2,944,172 | 7/1960 | Opitz et al. | 219/121 EP X |
| 3,007,371 | 11/1961 | Tallman | 350/514 |
| 3,169,183 | 2/1965 | Radtke et al. | 219/121 EP |
| 3,637,283 | 1/1972 | Tasaki et al. | 350/515 |
| 3,840,721 | 10/1974 | Monk | 219/121 EP X |
| 3,842,236 | 10/1974 | Von Walter | 219/121 EP X |
| 3,914,057 | 10/1975 | Smith et al. | 350/510 X |
| 4,571,038 | 2/1986 | Jako | 350/519 X |

FOREIGN PATENT DOCUMENTS 1345157  1/1974  United Kingdom ................ 350/515

Primary Examiner—C. L. Albritton
Attorney, Agent, or Firm—Shyamala T. Rajender; L. E. Carnahan; Judson R. Hightower

[57] ABSTRACT

An improved optical system which provides the operator a stereoscopic viewing field and depth of vision, particularly suitable for use in various machines such as electron or laser beam welding and drilling machines. The system features two separate but independently controlled optical viewing assemblies from the eyepiece to a spot directly above the working surface. Each optical assembly comprises a combination of eye pieces, turning prisms, telephoto lenses for providing magnification, achromatic imaging relay lenses and final stage pentagonal turning prisms. Adjustment for variations in distance from the turning prisms to the workpiece, necessitated by varying part sizes and configurations and by the operator's visual accuity, is provided separately for each optical assembly by means of separate manual controls at the operator console or within easy reach of the operator.

22 Claims, 14 Drawing Figures

STEREOSCOPIC OPTICAL VIEWING SYSTEM

The United States Government has rights in this invention pursuant to Contract No. W-7405-ENG-48 between the U.S. Department of Energy and the University of California, for the operation of Lawrence Livermore National Laboratory.

This invention relates generally to optical viewing systems, more specifically to stereoscopic optical viewing systems and still more particularly to stereoscopic optical viewing systems for drilling, brazing, heat treatment, soldering and welding operations.

BACKGROUND OF THE INVENTION

In many manufacturing operations, the workpiece has to be kept in the operator's view while it is being manipulated for the intended purpose. Drilling, brazing, heat treatment, soldering and welding processes in various machining and manufacturing industries are some of the processes where the workpiece needs to be viewed from a remote location while work is in progress. Machines designed for these operations, therefore, include optical viewing systems or assemblies located at a position remote from the workpiece or work area.

Welding or drilling processes in general, and electron or laser beam welding or drilling in particular, require that the relative positions of the heat source, (which is the electron beam for electron beam welders and the laser beam for laser beam welders), and the weld joint be accurately established prior to the initiation of the welding cycle. This is especially crucial for electron beam welding because electron beam welding is an electric fusion welding process whereby a stream or beam of electrons is focused and made to impinge on a workpiece to melt it.

Electron beam welding and drilling machines and methods for the use thereof are generally known in the art. Electron beam welding is normally carried out in a high vacuum. The weldments produced are, therefore, relatively narrow. As a result, making visual alignment of the heat source and the weld joint becomes very difficult without an accurate establishment of their relative positions.

The major components of an electron beam welding machine generally comprise a suitable source for electrons such as the electron gun, a vacuum chamber large enough to house the workpiece, means for viewing the weld zone while welding is in progress and means for manipulating and adjusting the relative positions of the workpiece, the electron beam and the work table. To facilitate the requirements for proper alignment, most electron beam welding machines incorporate a monocular viewing device or system which permits the operator to view the welding area and to establish the correct position of the heat source relative to the weldment area. These monocular systems characteristically have restricted field of view, impaired depth perception, and limited welding effectiveness. A few commercially available units have recently included binocular eyepieces but the optical path remains essentially monocular with its attendant restrictions and limitations as mentioned above. Some of these prior art devices are exemplified in the following patents.

U.S. Pat. No. 4,304,982, "Optical Viewing System Associated Apparatus And Machines Equipped Therewith", issued Dec. 8, 1981 to James R. Gramse, describes replaceable shields for the optical components of the viewing system for protecting them from condensation of corrosive vapors which may be generated during the welding process.

U.S. Pat. No. 4,090,056, "Optical Viewing System For An Electron Beam Welder", issued May 16, 1978 issued to Herbert C. Lockwood and Salvatore M. Robelotto, is directed to an arrangement for protecting the optical system from vapor deposition and from the effects of radiation, and electrical charge.

All of these prior art viewing systems for electron beam welding devices use monocular viewing systems and do not address themselves to the problems associated with the narrow, restricted view path and depth of vision while the welding is in progress. These prior art optical viewing systems consist of a horizontally mounted monocular vision tube with internal illumination and reflecting mirrors which provide an optical line of sight along the electron beam. For welding facilities which handle a variety of workpiece sizes, weld configurations, a wide range of materials and dissimilar combinations, these viewing or monitoring systems with their attendant limitations, adversely affect weld quality and hamper productivity. Continuous welding operations carried out over long periods of time using monocular viewing systems, can also result in eye fatigue thereby interfering with the operator's visual acuity. This, in turn, results in diminished welding effectiveness. The prior art monocular viewing systems, therefore, suffer from the above disadvantages.

The foregoing status of the art indicates that there is a need for a viewing system which provides for not only a larger field of view and magnification of the workpiece but also a stereoscopic view thereof. It would, therefore, be desirable to have a viewing system, especially suited for application in electron beam welding, which produces both a magnified view of the weld area and a stereoscopic view, particularly considering the fact that the electron beam typically used is very narrow.

SUMMARY OF THE INVENTION

Accordingly, it is an object of the subject invention to provide an optical viewing system or assembly which provides a stereoscopic view of the workpiece.

Another object of the present invention is to provide two totally independent vision paths from the eye piece to the workpiece or work area.

Still another object of the invention is to enable an operator of a welding machine, particularly an electron beam welding machine, to distinguish the profile features of the weld and to take corrective measures in process to assure a proper weld.

Yet another object is to provide an optical viewing system or assembly which includes magnification of the work area or workpiece for better viewing.

Another object is to improve the alignment accuracy of an electron beam with the workpiece or weldment area in an electron beam welding apparatus.

Still another object is to improve the quality of the weldment and the productivity of the welding operator.

Yet another object of the present invention is to reduce operator eye fatigue.

Another object is to attenuate the visual discomfort and to improve the visual accuity of the operator during a welding or drilling operation.

Yet another object is to monitor the weld for irregularities or defects and to correct them while the welding is in process.

Additional objects, advantages and novel features of the invention, together with additional features contributing thereto and advantages accruing therefrom will be apparent from the following description of a preferred embodiment of the invention which is shown in the accompanying drawings, which are incorporated herein by reference and form an integral part hereof. The objects and advantages of the invention may be realized and attained by means of the instrumentalities and combinations particularly pointed out in the appended claims.

To achieve the foregoing and other objects and in accordance with the purpose of the present invention as broadly described herein, the subject invention is directed to a stereoscopic optical viewing system for viewing a workpiece while work is in progress. The present stereoscopic optical viewing system is particularly adapted for use with drilling and welding machines and more particularly with electron or laser beam welding and drilling apparatii or machines.

In electron beam welding, thermal electrons are generated in a high vacuum environment and directed to the workpiece by means of accelerating electrodes, converging lenses, reflecting mirror assemblies and other peripheral components. Generally, the electron gun in an electron beam welding machine is mounted on top of a welding chamber which can be evacuated. The gun is equipped with a tantalum or tungsten filament, an electrode disposed in proximity to and around the filament and a grounded anode. A power source is connected to the filament for heating it. When the filament is heated by the power source, a large cascade of thermal electrons is generated which is then accelerated by the high voltage applied across the filament and the anode to form an electron beam. A converging lens converges the emergent electron beam and focuses it on to a workpiece. The workpiece is heated by the electron beam and melted by the kinetic energy generated. By moving the workpiece in a desired direction and at a precise travel speed, by suitable means located external to the welding chamber, the workpiece is moved out of the electron beam path to enable the melted portions to solidly and form a weldment, or a hole, as the case may be. Visual optics are provided to permit viewing of the workpiece while the welding operation is in progress.

To overcome the problems associated with the prior art monocular systems, the subject optical viewing system utilizes two separate and independently controlled optical assemblies representing two separate optical paths, thereby providing a stereoscopic view of the workpiece. Each optical assembly comprises a combination of a pentagonal turning prism, an achromatic imaging relay lense, a telephoto lense for providing magnification, an eye piece, and a Baurenfiend turning prism. Adjustment for variations in distance from the turning prisms to the workpiece, necessitated by varying part sizes and configurations and the visual accuity of the operator, is provided separately for each optical assembly by means of separate manual controls at the operator console.

Means for adjusting the focal lengths and magnification levels of the telephoto lenses are provided within easy reach of the operator. Such means include but are not limited to gear and cam mechanisms, levers, sliding knobs and the like. Optical resolutions greater than about 25 microns are achieved at all viewing distances from the turning prisms to the workpiece within a 60 cubic inch vacuum chamber. To reduce the glare and radiation from the illumination source, variable intensity polarizing filters are positioned across the optical path towards the chamber side from the telephoto lenses.

The increased level of illumination required for the magnification range of the present viewing system is optionally provided through the addition of an in-chamber high intensity fiber optic lighting unit with two flexible light transmission tubes. These tubes can be manually positioned or adjusted to afford optimal illumination suitable for each specific workpiece and its geometric configuration. Transparent glass covers are provided to protect the fiber optic terminal elements from corrosive vapors and radiation damage during the welding process. These glass covers are readily removable for cleaning between welding operations.

Specifically, the optical viewing system of the present invention for applications involving the use of particle beams such as photon or laser beams, electron and ion beams and the like, comprises a pentagonal prism to receive an optical image of the workpiece from a first direction which is substantially parallel to the particle beam axis and to reflect and propagate it in a second direction which is substantially 90° relative to the first direction; a focusing lens for receiving and focusing the image at a predetermined distance, an assembly of prisms (a Baurenfiend prism) to receive and invert the image and an eye piece to view the image.

Still more specifically, the stereoscopic viewing system of the subject invention comprises a pair of separate and independently controlled optical viewing assemblies, each assembly comprising a pentagonal prism, positioned adjacent to but spaced apart from the particle beam axis and positioned to receive an optical image of the workpiece from a first direction which is substantially parallel to the particle beam axis and to reflect the image so that the image now propagates in a second direction that is rotated by substantially 90° with respect to the first direction; a focusing lens positioned to receive the optical image from the pentagonal prism as the image propagates along the second direction and to focus the image at a predetermined distance from the focusing lens; a hollow, cylindrical tube positioned adjacent to the focusing lens at one end of the tube with the tube axis substantially parallel to the second direction, and positioned to receive the image after the image has passed through the focusing lens and to guide the image along the tube axis; a polarizing filter, positioned adjacent to a second end of the tube with the plane of the filter being substantially perpendicular to the direction of the tube axis, with the filter being rotatable in the filter plane to vary the direction of polarization; a telephoto lens with manually adjustable focal length, positioned at one end thereof adjacent to the polarizing filter to receive the image from the polarizing filter and to magnify the image by a controllable amount; a Baurenfiend prism positioned adjacent to the telephoto lens at a second end thereof to receive the image from the telephoto lens and invert the image; an eye piece with variable magnification positioned adjacent to the Baurenfiend prism to receive the image from the Baurenfiend prism.

The present viewing system offers twice the field of view as most monocular systems, thereby enabling the operator to improve alignment accuracy and reduce overall set up time. It also enables in-process identification and correction of weld deficiencies and an improvement in the quality of the weldment.

While the optical viewing system of the instant invention is particularly adapted for use with electron beam welding and drilling machines, it may be used with advantage in any other type of apparatus or equipment where viewing of a workpiece in operation is crucial to the success of the operation. Such applications include but are not limited to fabrication of automotive and aircraft engine parts, laser drilling and welding operations and the like.

BRIEF DESCRIPTION OF THE DRAWINGS

The accompanying drawings, which are incorporated and form a part of the specification, illustrate an embodiment of the invention and, together with the description, serve to explain the principles of the invention.

DETAILED DESCRIPTION OF THE PREFERRED EMBODIMENT

Figure 1:
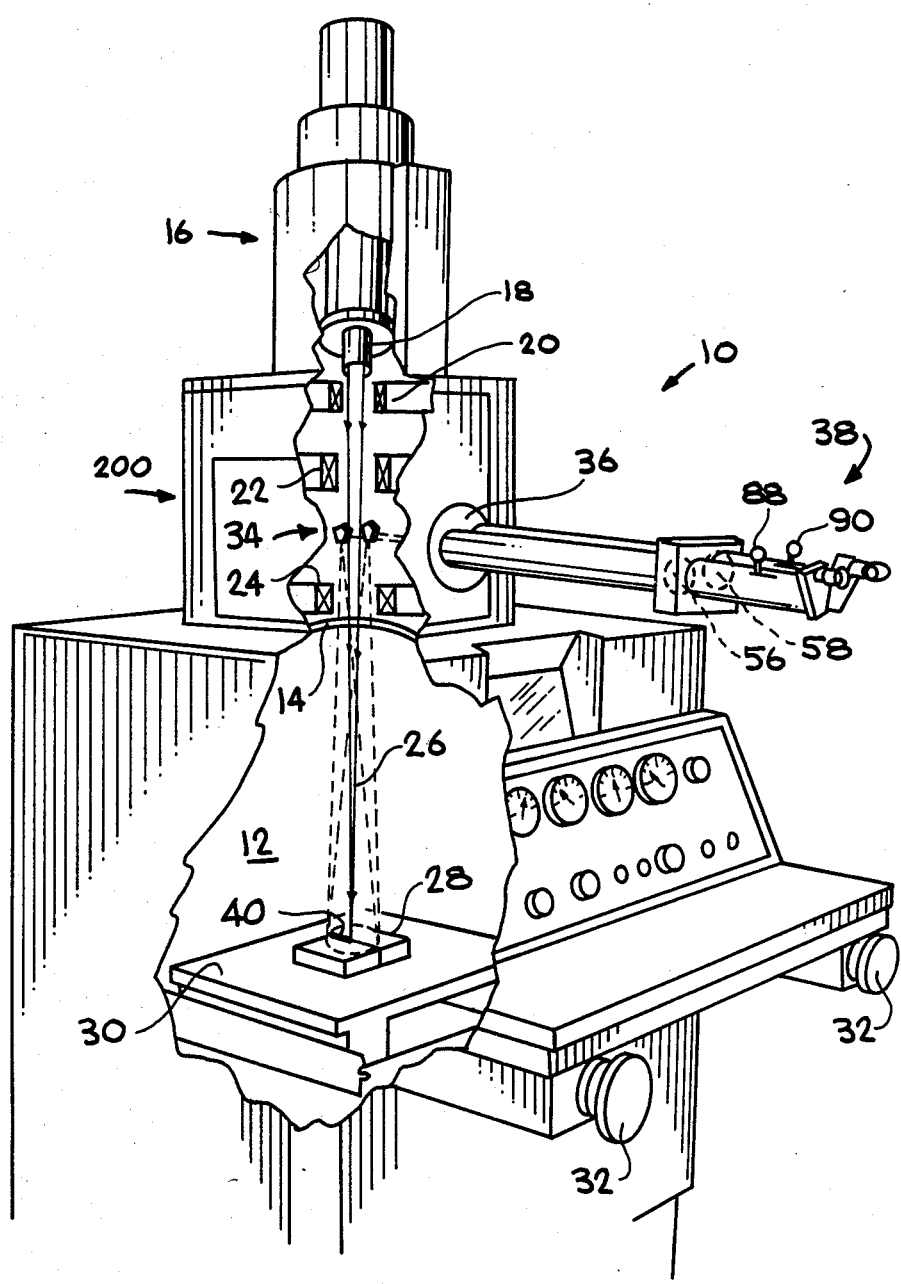
FIG. 1 is an overall view of an electron beam welding machine incorporating the present stereoscopic optical viewing system.

The present invention provides a stereoscopic optical viewing system for a workpiece or area which requires viewing the workpiece or area while work is in progress. While the instant optical viewing system is particularly adapted to operations involving illumination or irradiation with a particle beam such as a photon, electron or laser beam, for drilling, welding and other similar operations, it is equally suitable or adaptable for other applications where the workpiece needs to be viewed while operations or manipulations on the workpiece are in progress. As used herein, illumination or irradiation includes without limitation, focusing or converging on an object, a source of a beam of particles which in turn include without limitation, photons in the visible, infrared or uv range, electrons, ions, lasers, and other atomic and subatomic particles.

The subject optical viewing system provides two separate and independently controlled lines of vision and provides a stereoscopic view of the work area or the workpiece as desired. To provide such stereoscopic view, the optical system utilizes two separate and independently controlled optical assemblies. Each optical assembly comprises a combination of a pentagonal turning prism, an achromatic imaging relay lense, a telephoto lense for providing magnification, an eye piece, a Baurenfiend turning prism and the like. Adjustment for variations in distance from the turning prisms to the workpiece, necessitated by varying part sizes and configurations and the visual accuity of the operator, is provided separately for each optical path by means of separate manual controls at the operator console.

Means for adjusting the focal lengths and magnification levels of the telephoto lenses and the focal lengths of the pentagonal prisms are provided within easy reach of the operator. Optical resolutions greater than about 25 microns are achieved at all viewing distances from the turning prisms to the workpiece within a 60 cubic inch vacuum chamber. To reduce the glare and radiation from the illumination source, variable intensity polarizing filters are positioned across the optical path towards the chamber side from the telephoto lenses.

The increased level of secondary illumination required for the magnification range of the present optical viewing system is provided through the addition of an high intensity fiber optic lighting unit with two flexible light transmission tubes, positioned inside the welding chamber. These tubes can be manually positioned or adjusted to afford optimal illumination suitable for each specific workpiece and its geometric configuration. Transparent glass covers are provided to protect the fiber optic terminal elements from corrosive vapors and radiation damage during the welding process. These glass covers are readily removable for cleaning between welding operations.

One embodiment of the present invention, particularly adapted for use with electron beam welding apparatii, is described in detail and illustrated in the accompanying drawings which form a part hereof. It is, however, not intended that the application of the subject viewing system is limited to electron beam welding and such welding apparatii. The instant stereoscopic viewing system is equally adaptable, with few modifications, to laser welding and drilling, machine fabrication of automotive and aircraft parts and other similar uses.

Specifically, the optical viewing system of the present invention for applications involving the use of particle beams such as photon or laser beams, electron and ion beams and the like, comprises a pentagonal prism to receive an optical image of the workpiece from a first direction which is substantially parallel to the particle beam axis and to reflect and propagate it in a second direction which is substantially 90° relative to the first direction; a focusing lens for receiving and focusing the image at a predetermined distance, an assembly of prisms (a Baurenfiend prism) to receive and invert the image and an eye piece to view the image.

In detail, the optical viewing system of the present invention comprises a pair of separate and independently controlled optical viewing assemblies, each assembly comprising a pentagonal prism, positioned adjacent to but spaced apart from the electron beam axis and positioned to receive an optical image of the workpiece from a first direction which is substantially parallel to the electron beam axis and to reflect the image so that the image now propagates in a second direction that is rotated by substantially 90° with respect to the first direction; a focusing lens positioned to receive the optical image from the pentagonal prism as the image propagates along the second direction and to focus the image at a predetermined distance from the focusing lens; a hollow, cylindrical tube positioned adjacent to the focusing lens at one end of the tube with the tube axis substantially parallel to the second direction, and positioned to receive the image after the image has passed through the focusing lens and to guide the image along the tube axis; a polarizing filter, positioned adjacent to a second end of the tube with the plane of the filter being substantially perpendicular to the direction of the tube axis, with the filter being rotatable in the filter plane to vary the direction of polarization; a telephoto lens with manually adjustable focal length, positioned at one end thereof adjacent to the polarizing filter to receive the image from the polarizing filter and to magnify the image by a controllable amount; a Baurenfiend prism positioned adjacent to the telephoto lens at a second end thereof to receive the image from the telephoto lens and invert the image; an eye piece with variable magnification positioned adjacent to the Baurenfiend prism to receive the image from the Baurenfiend prism; and an eye piece to receive, further magnify and view the image.

Secondary illumination to the workpiece may be optionally provided by the addition of an in-chamber high intensity fiber optic lighting unit with a flexible light transmission tube or fiber optic bundle which bifurcates towards the end thereof into two linear segments and terminate in two, adjustable focusing lenses. These tubes or fiber optic bundles can be manually positioned or adjusted to afford optimal illumination suitable for each specific workpiece and its geometric configuration. Transparent glass covers are provided to protect the fiber optic terminal elements from corrosive vapors and radiation damage during the welding process. These glass covers are readily removable for cleaning between welding or drilling operations.

Now referring to the drawings in detail, the numeral 10 in FIG. 1, generally indicates an electron beam welding assembly which includes a vacuum chamber 12 which has a top opening or well 14 on which an electron gun assembly, generally indicated at 16, is mounted. The electron gun assembly is of a conventional type known in the art, for generating and focusing a high energy electron beam along a vertical axis downward through the opening 14. Vacuum chamber 12 may be of any suitable size, shape or type of an airtight enclosure with a suitable sealed door or opening (not shown in the diagram) to provide access to the interior of the vacuum chamber. The electron gun assembly 16 includes a cathode 18, an anode 20, focusing coils 22 and deflecting coils 24, to facilitate acceleration and convergence of an electron beam 26 on to a weld spot 40 on the workpiece 28.

A horizontal work table 30 is provided within the chamber on which the workpiece 28 is mounted or supported. Work table 30 is provided with means for moving or rotating it along a horizontal plane by means of suitable external controls or knobs 32, so that workpiece 28 is adjustable relative to the electron beam 26 which is directed vertically downward from the electron gun assembly 16. The vacuum chamber 12 is connected to a vacuum pump equipment (not shown) for producing a high vacuum within the chamber.

A mirror assembly, indicated generally at 34, is removably mounted in a port 36, and is arranged to direct light passing upward from the impact of electron beam 26 with workpiece 28 in the direction of the electron beam out through port 36. A secondary source of illumination, comprising a high intensity fiber optic lighting unit, shown in detail in FIG. 10, generally indicated at 200, is mounted inside welding chamber 12. A viewing assembly, indicated generally at 38, is mounted in the port 40.

Viewing assembly 38 optionally includes a camera for receiving the light and forming an image of the impact area on a suitable monitor (not shown). The optical components of the viewing assembly are shown in greater detail in FIGS. 2, 3, 4, 5, 6 and 7.

Figure 2:
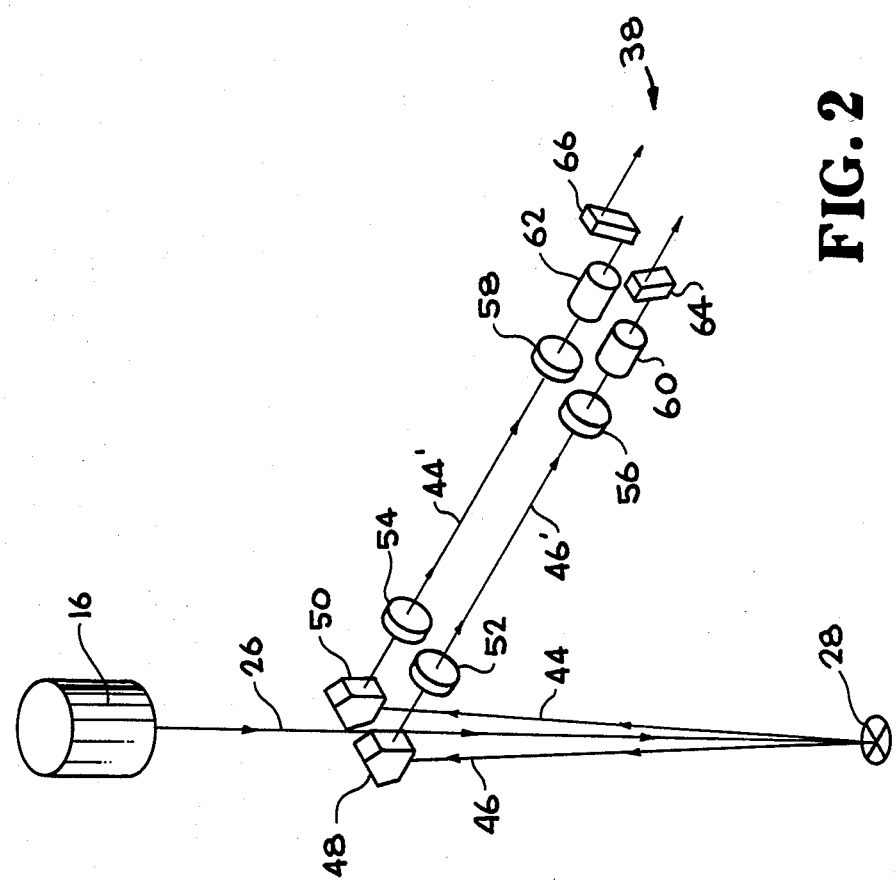
FIG. 2 is a schematic diagram of the optical components of the viewing system of the present invention.

FIG. 2 shows a schematic view of the optical components of the viewing assembly 38 of the subject invention. Electron beam 26 produced by the electron gun assembly 16 is focused onto workpiece 28. Optical images of workpiece 28 indicated by light beams 44 and 46, from a secondary illumination source generally indicated at 42 (shown in greater detail in FIG. 10) which are parallel to the electron beam axis, are received by the first and second pentagonal prisms 48 and 50. The images are then rotated about 90° by prisms 48 and 50 and are then propagated as beams 44' and 46' in a direction that is perpendicular to the electron beam axis. Acnromatic imaging relay lenses 52 and 54 receive the images from pentagonal prisms 48 and 50 and transmit them to a predetermined distance depending on the focal lengths of the lenses 52 and 54 onto polarizing filters 56 and 58. Polarizing filters 56 and 58 are positioned in such a manner as to have the plane of the filters perpendicular to the direction of light beams 44' and 46'. Filters 56 and 58 are provided with means for rotating them in the plane of the filter to vary the direction of polarization (see FIG. 7). Telephoto lenses 60 and 62 are provided in the path of light beam 44' and 46', towards the eyepieces (not shown) to receive the images from filters 56 and 58 and magnify the images to a predetermined and controllable size. Baurenfiend prisms systems generally indicated at 64 and 66 (shown in FIG. 4) are provided to receive the magnified images from telephoto lenses 60 and 62 and invert the images. Eyepieces (see FIG. 3), with variable magnification, are provided for viewing the images from the Baurenfiend prism systems.

Figure 3:
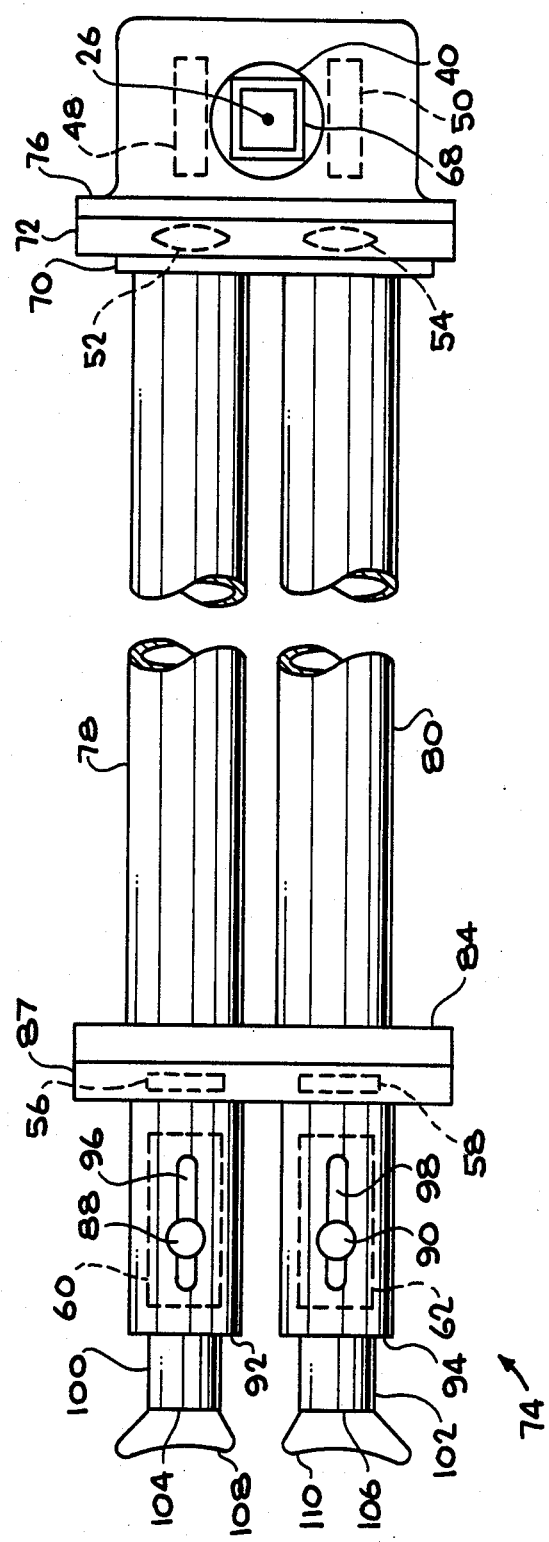
FIG. 3 illustrates an embodiment of the major mechanical components of the optical viewing system.
Figure 4:
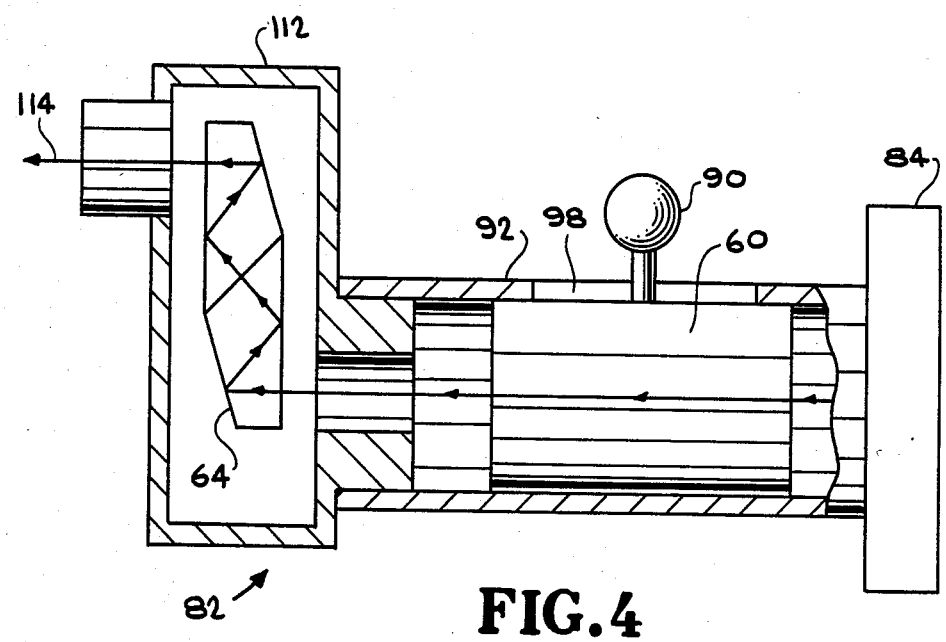
FIG. 4 is a view, partially in cross-section, of an embodiment of the telephoto lens assembly, the eye piece and focusing prism of the optical system.

FIG. 3 shows an embodiment of the physical components of the viewing assembly 38 of the subject invention. Pentagonal prisms 48 and 50 are rotatably mounted on the two side surfaces of electron beam guide tube 68 (through which electron beam 26 is directed to workpiece 28). A face plate 72 with imaging relay lenses 52 and 54 mounted thereon is attached to housing 76 by means not shown. Relay lenses 52 and 54 are mounted on an axis which is substantially perpendicular to the electron beam axis and to align with the line of vision (not shown in this figure). A pair of hollow conduits or tubes 78 and 80 are connected at one end thereof by means of collar or flange 70 to face plate 72. Conduits 78 and 80 are preferably cylindrical but may be any suitable shape such as a square, rectangular, octagonal, hexagonal etc., and may be made of any suitable material. A retaining plate 84, with polarizing filters 56 and 58 mounted thereon, is attached to the other end of conduits 78 and 80. Filters 56 and 58 are rotatably mounted by sliding rod mechanism 86 (see FIG. 7) which slides in and out laterally, to vary the direction of polarization by sliding a rod in either direction in a lateral movement. Telephoto lenses 60 and 62 are housed in casing or housing 92 and 94 which in turn is attached to retaining plate 84 via mechanism 86 by means (not shown) known in the art. Control knobs 88 and 90 are mounted in slots 96 and 98 in casing 92 and 94, to adjust the focal length of telephoto lenses 60 and 62 as shown in FIG. 4. Attached to the second or other end of casings 92 and 94 is a housing 112 in which Baurenfiend prisms 64 and 66 (see FIG. 4) set by means not shown. Eye pieces 100 and 102 which house viewing lenses 104 and 106 are secured to housing 112. Eye cups 108 and 110 are provided to fit over eye pieces 100 and 102 for viewing comfort.

FIG. 4 illustrates the components of a portion of one of the two optical viewing assemblies 38 comprising the present viewing system. Telephoto lens 60 is housed in casing 92 which is attached at one end thereof to sliding rod mechanism 86. A slot 98 is provided in casing 92 to accommodate movement of a knob 90 attached to lens 60. By laterally sliding knob 90 in slot 98, the focal length of telephoto lens 60 may be varied to adjust to the eye sight or visual accuity of the operator. The second or other end of casing 92 is attached to housing 112 by means not shown. Baurenfiend prism 64 is mounted within housing 112 (by means not shown). Baurenfiend prism 84 inverts the image of workpiece 28, magnified and propagated by telephoto lens 60 and reflects it to eye piece 106 via collar 114.

Figure 5:
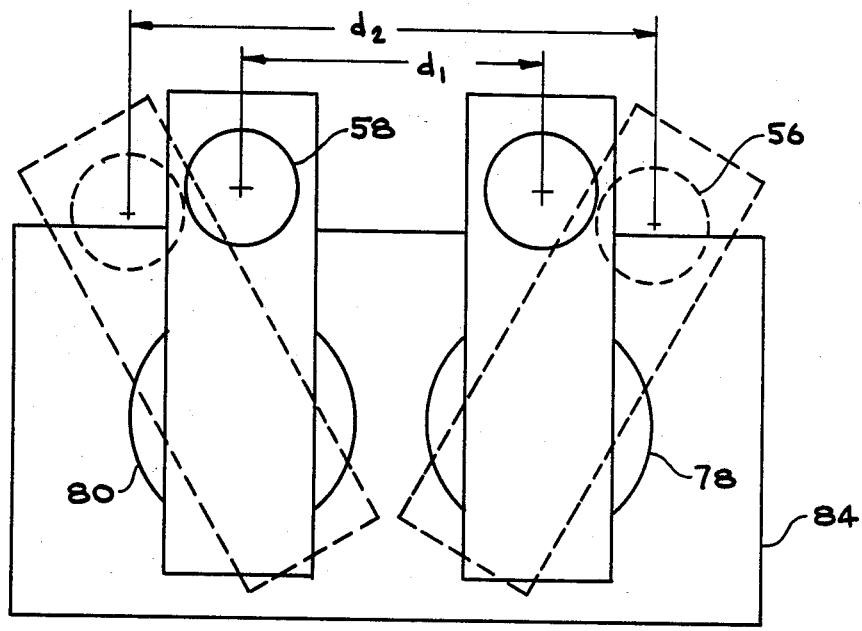
FIG. 5 illustrates the adjustment mechanism for the telephoto lens to accommodate the visual accuity of the operator.

FIG. 5 illustrates a diagrammatic view of the variation in the direction of polarization of polarizing filters 56 and 58. Retaining plate 84 which is attached to conduits 78 and 80 houses filters 56 and 58. The line of sight is indicated at 87. By moving the ratchet mechanism laterally in and out, as shown in FIG. 7, from distance $d_1$ to $d_2$, filters 56 and 58 are rotated, thereby varying the direction of polarization of the light propagated from the telephoto lenses.

Figure 6:
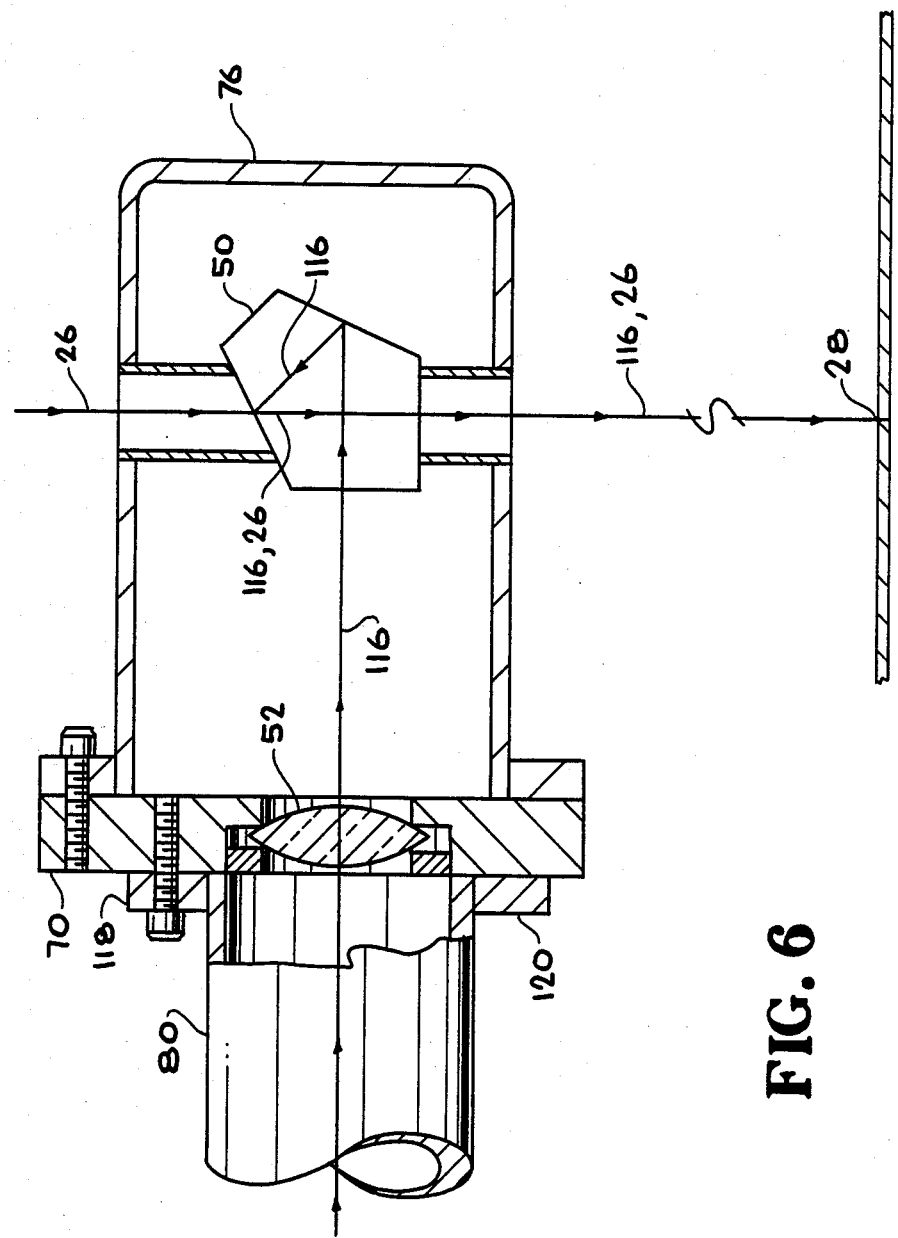
FIG. 6 illustrates a portion of the apparatus which shows the position of the pentagonal prisms for focusing the electron beam.

FIG. 6 illustrates the position of pentagonal prism 50 mounted inside housing or tube 76 (using means not shown) relative to the axis of propagation of electron beam 26 and the line of vision 116. Relay lens 52 is mounted along the axis of the line of vision 116 in face plate 72. Plate 72 is secured to flange 70 on conduit 80 and to a flange 118 on tube 76 for securing lens 52 and conduit 80 thereto. Housing or tube 76 is provided with a tube 120 extending therethrough within which prism 50 is mounted.

Figure 7:
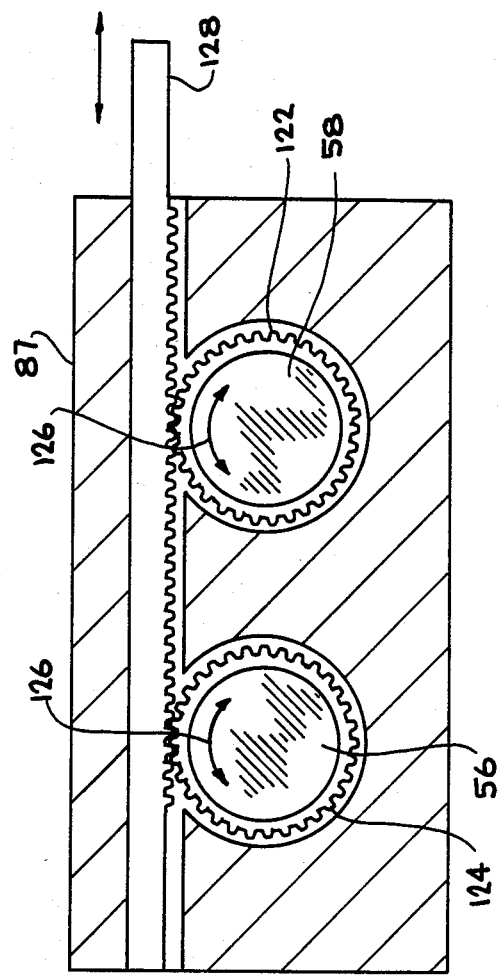
FIG. 7 illustrates the polarization filters with the adjustment lever to rotate the lenses in and out of the vision path.

FIG. 7 show the gear mechanism for rotating polarizing filters 56 and 58 to vary the direction of polarization of the incoming beam of light 44' (not shown). A ratchet 128, provided with serrations, is mounted in engaging relationship with gear wheels 122 and 124 connected to the filters 56 and 58, which are provided with serrations corresponding to and to engage serrations on ratchet 128. By sliding ratchet 128 in the direction of the arrows 126, polarizing filters 56 and 58 are rotated in and out of the light beam 44' (see FIG. 5), thereby varying the direction of polarization of the light beam.

Figure 8A:
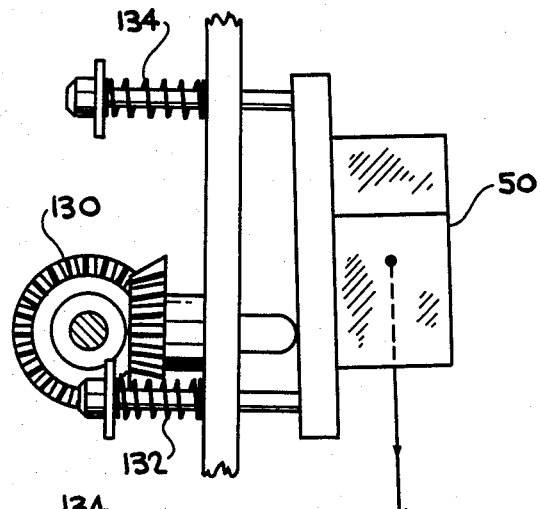
FIGS. 8A-8C provide a view of a gear mechanism for rotating the pentagonal prisms to different positions.
Figure 8B:
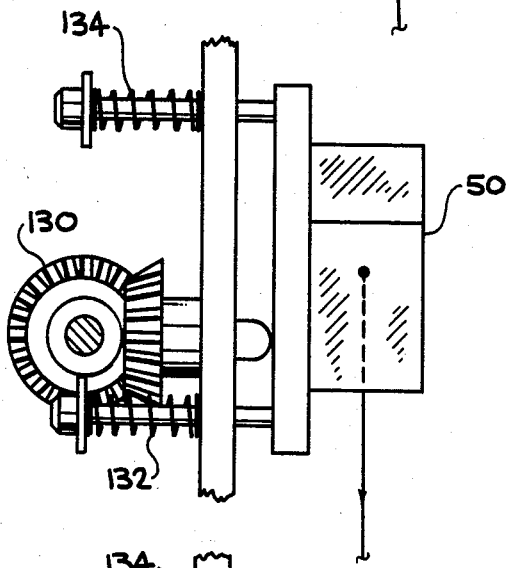
Figure 8C:
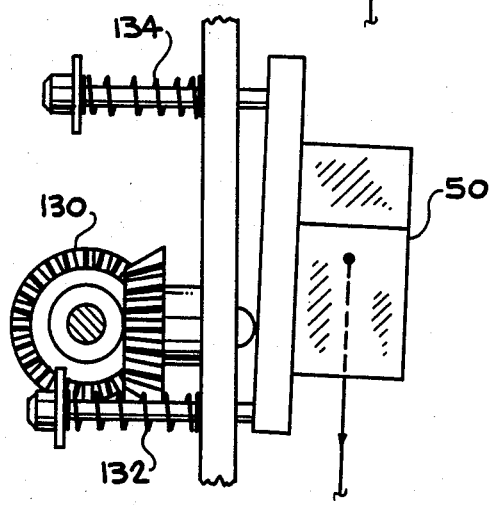
Figures 9A, 9B, 9C:
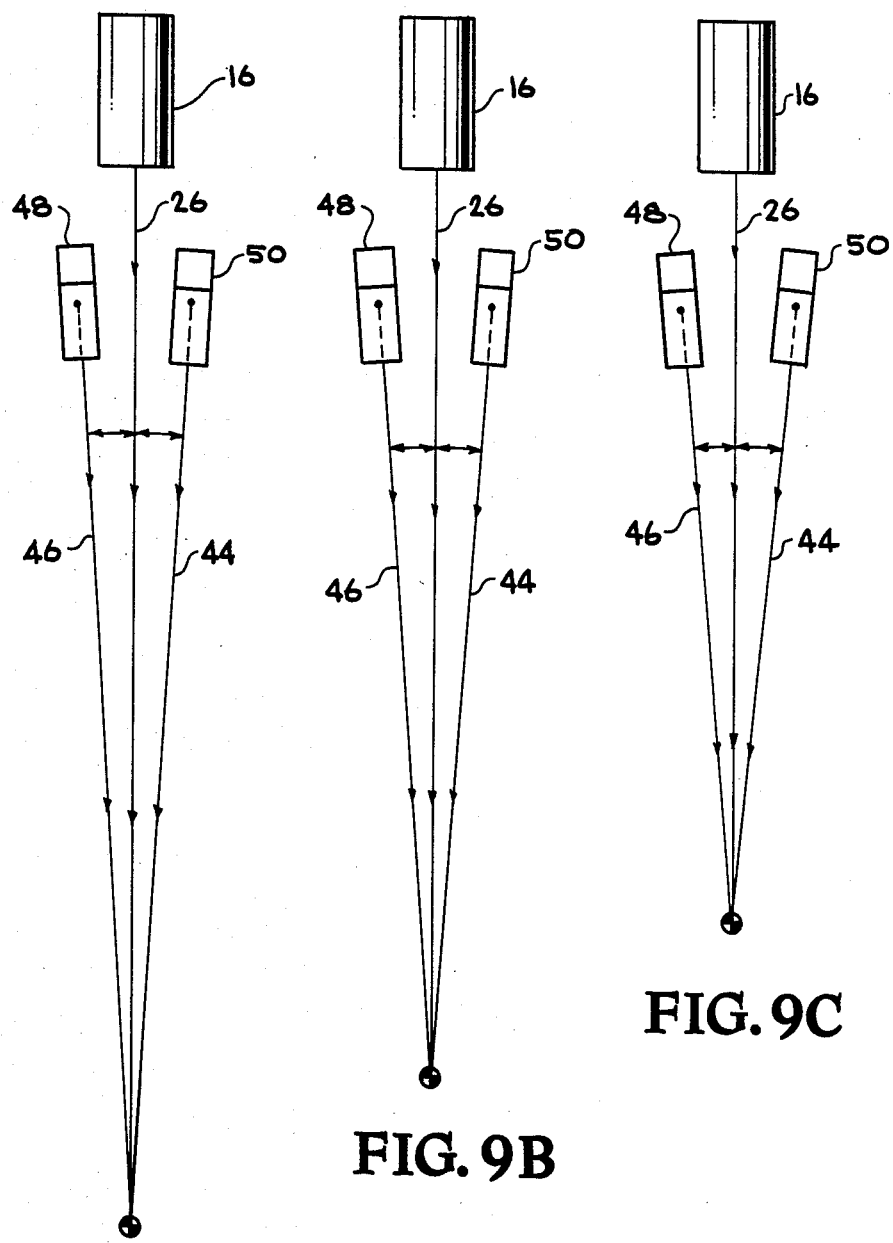
FIGS. 9A-9C show the varying focal length of the pentagonal prisms when they are rotated as shown in FIGS. 8A-8C.

FIGS. 8A–8C illustrate a gear and cam mechanism generally indicated at 130 for rotating pentagonal prisms 48 and 50 (only one shown) in two planes. The mechanism 130 includes a spring-biased means 132 and 134 interconnecting plates 136 and 138. A movable pin or cam 140 secured to a gear arrangement 142 extends through plate 138. By turning the gear arrangement 142, the cam 140 extends further through or withdrawn from plate 138 as shown in FIGS. 8A and 8C, to tilt plate 136 with respect to plate 138, whereby the prism mount is tilted up or down, changing the angle of light incidence on prisms 48 and 50. FIG. 8B of illustrates the "rest" position, with FIGS. 8A and 8C illustrating the rotation in the first and second planes respectively. By varying the position of the prism angle, the focal length of the prism may be varied as desired, to suit the operator's visual accuity as shown in FIGS. 9A–9C as by increasing or decreasing the focal length.

Figure 10:
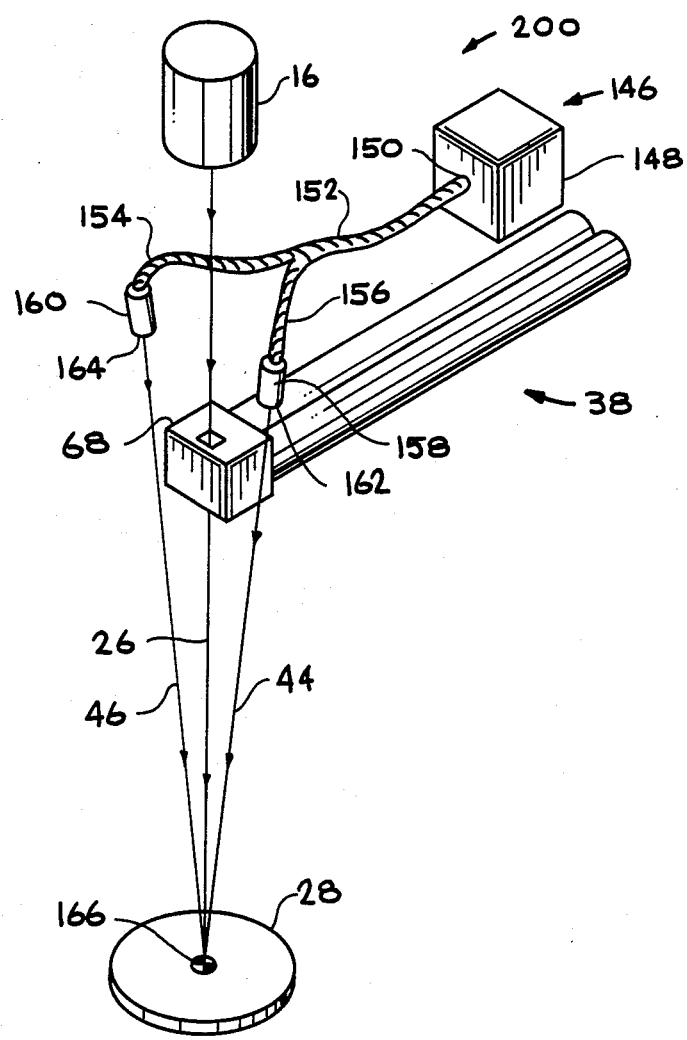
FIG. 10 illustrates the secondary illumination means for the viewing system.

FIG. 10 illustrates the secondary illumination assembly in conjunction with the subject optical viewing system, comprising a high intensity fiber optic lighting unit. A high intensity light source or bulb generally indicated at 146 is mounted inside a closed housing 148. Housing 148 is provided with a port 150. A thin, flexible light-transmitting tube or fiber optic bundle 152 is secured to housing 148 via port 150, by known means such as washers, O-rings, nuts and bolts etc and propagate the light from bulb 146 to workpiece 28 along an axis that is substantially parallel to the axis of the electron beam 26 generated by the electron gun assembly 16. Tube 150 bifurcates near the end thereof into two segments 154 and 156 and terminates in two focusing lenses 158 and 160 which focus the light beams 44 and 46 onto a weld spot 166 and reflect them to the viewing assembly 38. Lenses 158 and 160 are optionally capped with transparent glass covers or shields, generally indicated at 162 and 164, to shield them from noxious vapors that are generated during the welding operation. The light assembly is mounted inside the welding chamber 12 by any suitable means (not shown) and spaced apart from the viewing assembly 38.

It has been shown that the invention also provides a method for the stereoscopic viewing of a workpiece while operations on the workpiece are in progress. The method comprises providing an optical viewing system comprising a pair of separate and independently controlled optical assemblies, each optical assembly consisting of the elements described hereinbefore. Exemplary operations on the workpiece include but are not limited to welding, drilling and machining.

It has thus been shown that the present invention provides a stereoscopic viewing system comprising two separate by independently controlled optical assemblies. The stereoscopic viewing system fills the need which has existed in the art of welding and drilling operations. It offers twice the field of view as most monocular systems, thereby enabling the operator to improve alignment accuracy and reduce overall set up time. It also enables in-process identification and correction of weld deficiencies and an improvement in the quality of the weldment.

While the optical viewing system of the instant invention is particularly adapted for use with electron beam welding and drilling machines, it may be used with advantage in any other type of apparatus or equipment where viewing of a workpiece in operation is crucial to the success of the operation. Such applications include but are not limited to fabrication of automotive and aircraft engine parts, laser drilling and welding operations and the like.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A pair of independently controlled stereoscopic optical viewing assemblies, each of said pair of assemblies comprising:
- a prism means to receive an optical image of the workpiece from a first direction and to reflect said image so that said image now propagates in a vision path along a second direction that is rotated by substantially 90° relative to said first direction;
- means positioned in the vision path to receive, magnify by a controllable amount, focus and invert said image; and
- means for viewing said image.

2. The optical assembly of claim 1 wherein said prism is a pentagonal prism.

3. The optical assembly of claim 1 wherein said means positioned in the vision path comprises the combination of a Baurenfiend prism and a telephoto lens.

4. A pair of independently controlled stereoscopic optical viewing assemblies for monitoring the position and orientation of a workpiece which is to be illuminated by passing a particle beam along an axis to the workpiece, each of said pair of assemblies comprising:
- a pentagonal prism, positioned adjacent to but spaced apart from the particle beam axis and positioned to receive an optical image of the workpiece from a first direction substantially parallel to the particle beam axis and to reflect said image so that said image now propagates in a second direction that is rotated by substantially 90° with respect to said first direction;
- a focusing lens positioned to receive said optical image from said pentagonal prism as said image propagates along said second direction and to focus said image at a predetermined distance from said focusing lens;
- a Baurenfiend prism positioned adjacent to said focusing lens at a second end thereof to receive said image from said focusing lens and invert said image; and
- an eye piece with variable magnification positioned adjacent to said Baurenfiend prism to receive said image from said Baurenfiend prism.

5. The optical assembly of claim 4, additionally including a telephoto lens with manually adjustable focal length, positioned adjacent to said focusing lens to receive said image from said focusing lens and to further focus and magnify said image by a controllable amount.

6. The optical assembly of claim 5, further including a polarizing filter, positioned adjacent to said telephoto lens with the plane of the filter being substantially parallel to the direction of said particle beam axis, with the filter being rotatable in the filter plane to vary the direction of polarization.

7. The optical assembly of claim 6, additionally including means for secondary illumination of said workpiece.

8. The optical assembly of claim 7 wherein said means for secondary illumination comprises fiber optic means.

9. The optical assembly of claim 8 wherein said fiber optic means comprises an in-chamber high intensity fiber optic lighting unit with flexible light transmission tubes terminating in focusing lenses.

10. A pair of independently controlled stereoscopic optical viewing assemblies for monitoring the position and orientation of a workpiece which is to be illuminated by passing a particle beam along an axis to the workpiece, each of said pair of assemblies comprising:
- a pentagonal prism, positioned adjacent to but spaced apart from the particle beam axis and positioned to receive an optical image of the workpiece from a first direction substantially parallel to the particle beam axis and to reflect said image so that said image now propagates in a second direction that is rotated by substantially 90° with respect to said first direction;
- a focusing lens positioned to receive said optical image from said pentagonal prism as said image propagates along said second direction and to focus said image at a predetermined distance from said focusing lens;
- a hollow tube positioned adjacent to said focusing lens at one end of said hollow tube with said tube axis substantially parallel to said second direction, and positioned to receive said image after said image has passed through said focusing lens and to guide said image along said tube axis;
- a polarizing filter, positioned adjacent to a second end of said tube with the plane of the filter being substantially perpendicular to the direction of said tube axis, with the filter being rotatable in the filter plane to vary the direction of polarization;
- a telephoto lens with manually adjustable focal length, positioned at one end thereof adjacent to said polarizing filter to receive said image from said polarizing filter and to magnify said image by a controllable amount;
- a Baurenfiend prism positioned adjacent to said telephoto lens at a second end thereof to receive said image from said telephoto lens and invert said image; and
- an eye piece with variable magnification positioned adjacent to said Baurenfiend prism to receive said image from said Baurenfiend prism.

11. The optical assembly of claim 10, additionally including means for secondary illumination of said workpiece.

12. The optical asembly of claim 11 wherein said means for secondary illumination comprises fiber optic means.

13. The optical assembly of claim 12 wherein said fiber optic means comprises an in-chamber high intensity fiber optic lighting unit with flexible light transmission tubes terminating in focusing lenses.

14. In an electron beam welding machine comprising an electron gun having a filament, a heating power source for supplying an electric current to the filament to heat it and generate a cascade of electrons, a high voltage power source for accelerating the electrons to form an electron beam, a converging lens for converging and focusing the electron beam from the electron gun and irradiating the electron beam onto a workpiece, and an optical viewing system, the improvement wherein the optical viewing system comprises a pair of separate and independently controlled steroscopic optical viewing assemblies, each of said stereoscopic viewing assemblies comprising:
- a pentagonal prism, positioned adjacent to but spaced apart from the particle beam axis and positioned to receive an optical image of the workpiece from a first direction substantially parallel to the particle beam axis and to reflect said image so that said image now propagates in a second direction that is rotated by substantially 90° with respect to said first direction.

a focusing lens positioned to receive said optical image from said pentagonal prism as said image propagates along said second direction and to focus said image at a predetermined distance from said focusing lens;

a hollow tube positioned adjacent to said focusing lens at one end of said hollow tube with said tube axis substantially parallel to said second direction, and positioned to receive said image after said image has passed through said focusing lens and to guide said image along said tube axis;

a polarizing filter, positioned adjacent to a second end of said tube with the plane of the filter being substantially perpendicular to the direction of said tube axis, with the filter being rotatable in the filter plane to vary the direction of polarization;

telephoto lens with manually adjustable focal length, positioned at one end thereof adjacent to said polarizing filter to receive said image from said polarizing filter and to focus and magnify said image by a controllable amount;

a Baurenfiend prism positioned adjacent to said telephoto lens at a second end thereof to receive said image from said telephoto lens and invert said image; and an eye piece with variable magnification positioned adjacent to said Baurenfiend prism to receive said image from said Baurenfiend prism.

15. An electron beam welding apparatus comprising an electron gun having a filament, a heating power source for supplying an electric current to the filament to heat it and generate a cascade of electrons, a high voltage power source for accelerating the electrons to form an electron beam, a converging lens for converging and focusing the electron beam from the electron gun and irradiating the electron beam onto a workpiece, and a stereoscopic optical viewing system wherein said optical viewing system comprises a pair of separate and independently controlled stereoscopic optical viewing assemblies, each of said pair of stereoscopic optical viewing assemblies comprising:

a pentagonal prism, positioned adjacent to but spaced apart from the particle beam axis and positioned to receive an optical image of the workpiece from a first direction substantially parallel to the particle beam axis and to reflect said image so that said image now propagates in a second direction that is rotated by substantially 90° with respect to said first direction;

a focusing lens positioned to receive said optical image from said pentagonal prism as said image propagates along said second direction and to focus said image at a predetermined distance from said focusing lens;

a hollow tube positioned adjacent to said focusing lens at one end of said hollow tube with said tube axis substantially parallel to said second direction, and positioned to receive said image after said image has passed through said focusing lens and to guide said image along said tube axis;

a polarizing filter, positioned adjacent to a second end of said tube with the plane of the filter being substantially perpendicular to the direction of said tube axis, with the filter being rotatbLe in the filter plane to vary the direction of polarization;

a telephoto lens with manually adjustable focal length, positioned at one end thereof adjacent to said polarizing filter to receive said image from said polarizing filter and to focus and magnify said image by a controllable amount;

a Baurenfiend prism positioned adjacent to said telephoto lens at a second end thereof to receive said image from said telephoto lens and invert said image; and an eye piece with variable magnification positioned adjacent to said Baurenfiend prism to receive said image from said Baurenfiend prism.

16. The welding apparatus of claim 15, additionally including means for secondary illumination of said workpiece.

17. The welding apparatus of claim 16 wherein said means for secondary illumination comprises fiber optic means.

18. The welding apparatus of claim 17 wherein said fiber optic means comprises an in-chamber high intensity fiber optic lighting unit with flexible light transmission tubes terminating in focusing lenses.

19. A method for the stereoscopic viewing of a workpiece comprising providing an optical viewing system having a pair of separate and independently controlled viewing assemblies, comprising the steps of:

positioning a pentagonal prism adjacent to but spaced apart from the particle beam axis and positioned to receive an optical image of the workpiece from a first direction substantially parallel to the particle beam axis and to reflect said image so that said image now propagates in a second direction that is rotated by substantially 90° with respect to said first direction;

providing a focusing lens to receive said optical image from said pentagonal prism as said image propagates along said second direction and to focus said image at a predetermined distance from said focusing lens;

positioning a hollow tube adjacent to said focusing lens at one end of said hollow tube with said tube axis substantially parallel to said second direction, and positioned to receive said image after said image has passed through said focusing lens and to guide said image along said tube axis;

placing a polarizing filter adjacent to a second end of said tube with the plane of the filter being substantially perpendicular to the direction of said tube axis, with the filter being rotatable in the filter plane to vary the direction of polarization;

providing a telephoto lens with manually adjustable focal length at one end thereof adjacent to said polarizing filter to receive said image from said polarizing filter and to magnify said image by a controllable amount;

positioning a Baurenfiend prism adjacent to said telephoto lens at a second end thereof to receive said image from said telephoto lens and invert said image; and providing an eye piece with variable magnification adjacent to said Baurenfiend prism to receive said image from said Baurenfiend prism.

20. The method of claim 19, additionally including providing means for secondary illumination of said workpiece.

21. The method of claim 20 wherein said means for secondary illumination is carried out by fiber optic means.

22. The method of claim 21 additionally including placing said fiber optic means in an in-chamber high intensity fiber optic lighting unit with flexible light transmission tubes terminating in focusing lenses.

* * * * *